(12) United States Patent
Bienholz

(10) Patent No.: US 12,134,816 B2
(45) Date of Patent: Nov. 5, 2024

(54) FLAT STEEL PRODUCT HAVING AN IMPROVED ZINC COATING

(71) Applicant: ThyssenKrupp Steel Europe AG, Duisburg (DE)

(72) Inventor: Stefan Bienholz, Bochum (DE)

(73) Assignee: ThyssenKrupp Steel Europe AG, Duisburg (DE)

( * ) Notice: Subject to any disclaimer, the term of this patent is extended or adjusted under 35 U.S.C. 154(b) by 0 days.

(21) Appl. No.: 18/035,378

(22) PCT Filed: Nov. 3, 2021

(86) PCT No.: PCT/EP2021/080485
§ 371 (c)(1),
(2) Date: May 4, 2023

(87) PCT Pub. No.: WO2022/101068
PCT Pub. Date: May 19, 2022

(65) Prior Publication Data
US 2023/0407455 A1    Dec. 21, 2023

(30) Foreign Application Priority Data
Nov. 13, 2020  (DE) ..................... 10 2020 214 293.9

(51) Int. Cl.
*C23C 14/16*    (2006.01)
*C22C 38/00*    (2006.01)
(Continued)

(52) U.S. Cl.
CPC ............ *C23C 14/16* (2013.01); *C22C 38/001* (2013.01); *C22C 38/002* (2013.01); *C22C 38/008* (2013.01); *C22C 38/02* (2013.01); *C22C 38/06* (2013.01); *C22C 38/42* (2013.01); *C22C 38/44* (2013.01); *C22C 38/46* (2013.01);
(Continued)

(58) Field of Classification Search
None
See application file for complete search history.

(56) References Cited

U.S. PATENT DOCUMENTS 3,788,877 A    1/1974  Helwig et al.
6,335,053 B1   1/2002  Arezzo et al.
(Continued)

FOREIGN PATENT DOCUMENTS

CN    109722690 A    5/2019
DE    102009045076 A1    4/2011
(Continued)

OTHER PUBLICATIONS

DIN EN ISO 17081—Common Knowledge Document.
(Continued)

*Primary Examiner* — Seth Dumbris
(74) *Attorney, Agent, or Firm* — RMCK Law Group PLC

(57) ABSTRACT

The present disclosure relates to a flat steel product comprising a steel substrate with, present at least on one side of the steel substrate, anticorrosion coating composed of zinc and unavoidable impurities. This anticorrosion coating has continuous microchannels which connect the steel substrate to an ambient atmosphere. Additionally, the present disclosure relates to a process for producing a flat steel product of this kind.

16 Claims, 2 Drawing Sheets

(51) Int. Cl.

| | |
|---|---|
| *C22C 38/02* | (2006.01) |
| *C22C 38/06* | (2006.01) |
| *C22C 38/42* | (2006.01) |
| *C22C 38/44* | (2006.01) |
| *C22C 38/46* | (2006.01) |
| *C22C 38/48* | (2006.01) |
| *C22C 38/50* | (2006.01) |
| *C22C 38/54* | (2006.01) |
| *C22C 38/58* | (2006.01) |
| *C23C 14/02* | (2006.01) |
| *C23C 14/30* | (2006.01) |
| *C23C 14/32* | (2006.01) |

(52) U.S. Cl.
CPC .............. *C22C 38/48* (2013.01); *C22C 38/50* (2013.01); *C22C 38/54* (2013.01); *C22C 38/58* (2013.01); *C23C 14/021* (2013.01); *C23C 14/30* (2013.01); *C23C 14/325* (2013.01); *Y10T 428/12757* (2015.01)

(56) References Cited

U.S. PATENT DOCUMENTS

| 8,048,285 | B2 | 11/2011 | Tran et al. | |
|---|---|---|---|---|
| 2008/0131721 | A1 | 6/2008 | Tran et al. | |
| 2019/0040511 | A1* | 2/2019 | Hasegawa | C22C 38/38 |
| 2020/0190617 | A1* | 6/2020 | Hasegawa | C21D 6/005 |
| 2021/0010100 | A1* | 1/2021 | Maeda | C21D 8/0205 |

FOREIGN PATENT DOCUMENTS

| DE | 102009053367 A1 | 5/2011 |
|---|---|---|
| EP | 3020842 B1 | 3/2019 |
| EP | 3660181 A1 | 6/2020 |
| KR | 20190077200 A | 7/2019 |

OTHER PUBLICATIONS

Electron-beam physical vapor deposition—Wikipedia, Oct. 11, 2019.

International Search Report and Written Opinion for International Application No. PCT/EP2021/080485 mailed Jan. 26, 2022.

Kang, Jee-Hyan et al. "Fe—Zn reaction and its influence on microcracks during hot tensile deformation of galvanized 22MnB5 steel" Surface and Coatings Technology, Elsevier, NL, Vo.. 357, Aug. 4, 2018, pp. 1069-1075.

Mehrphasen-Stähle für den Automobilbau—vom Stahlbereich von thyssenkrupp, Jun. 25, 2021.

Sabooni S. et al. "Microstructure and adhesion strength quantification of PVD bi-layered ZnMg—Zn coatings on DP800 steel" Surface and Coatings Technology, NL, vol. 359, Oct. 15, 2018, pp. 227-238.

Sep. 1931 (Technical Rule) Prüfung der Haftung von Zinküberzügen auf feuerverzinktem Feinblech, Kugelschlagprüfung (Testing the adhesion of zinc coatings on hot-dip galvanised thin sheet, ball impact test).

* cited by examiner

FLAT STEEL PRODUCT HAVING AN IMPROVED ZINC COATING

CROSS-REFERENCE TO RELATED APPLICATIONS

This application is a 371 U.S. National Stage of International Application No. PCT/EP2021/080485, filed Nov. 3, 2021 which claims the benefit of German Patent Application No. 10 2020 214 293.9 filed Nov. 13, 2020. The disclosures of each of the above applications are incorporated herein by reference in their entirety.

The invention relates to a flat steel product comprising a steel substrate having, present at least on one side of the steel substrate, anticorrosion coating composed of zinc and unavoidable impurities.

The invention also relates to a process for producing a flat steel product of this kind.

"Flat steel products" are understood in the present text to be rolled products whose length and width are each substantially greater than their thickness. They include, in particular, steel strips and steel sheets or blanks.

In the present text, in the absence of any explicit note to the contrary, figures for the amounts of alloy constituents are always given in % by mass.

The fractions of certain constituents in the structure of the steel substrate of a flat steel product are reported in area %, unless indicated to the contrary.

"Unavoidable impurities" of a steel, zinc or other alloy in the present text refer to technically unavoidable steel elements which enter the steel during production or cannot be entirely removed from it but whose amounts are at any rate so low that they have no effect on the properties of the steel or the coating.

Heavy-duty components of automobiles and trucks, such as crash structures and chassis of automobile bodies, require a galvanized steel sheet having a thickness of more than 1.5 mm and a tensile strength of more than 590 MPa (high-strength steel), more particularly more than 780 MPa (ultra-high-strength steel). The tensile strength for the purpose of this application is determined according to DIN EN ISO 6892, sample type 1.

The importance of such steels is continually increasing in the wake of electric vehicles. Components of the battery casing, for example, must be designed such that in the event of a crash there is no damage to the lithium-ion cells. Furthermore, high-strength and ultra-high-strength materials are appropriate for designing components with lower weight, through reduction in sheet thickness. As strengths increase, however, even with small amounts of diffusible hydrogen in the material, the risk of hydrogen-induced brittle fracture goes up.

KR20190077200A describes a hot dip coating of zinc which influences the hydrogen permeation. Here, particles 100 nm to 1000 nm in size are built into the layer in order to reduce the hydrogen permeation. With this measure it is possible at most to reduce the hydrogen uptake of the steel. Hydrogen already taken up at the pretreatment stage (strip cleaning, annealing) is no longer able there to escape.

U.S. Pat. No. 8,048,285B2 describes an electrolytically deposited ZnNi layer which exhibits low hydrogen embrittlement. The low hydrogen embrittlement results from the coating being permeable to hydrogen. The permeability is realized through the admixing of Ni to the electrolytic Zn layer. Ni, however, ought not to be used, owing to the harmful effect on health. The welding of ZnNi-coated components specifically produces Ni-containing welding fumes which are known to have a carcinogenic effect.

EP3020842B1 reduces the hydrogen embrittlement by trapping the hydrogen specifically in an internal oxide layer.

It is an object of the present invention to provide a flat steel product having an anticorrosion coating composed of zinc and unavoidable impurities, where the hydrogen embrittlement is reduced.

The object according to the invention is achieved by means of a flat steel product comprising a steel substrate having, present at least on one side of the steel substrate, anticorrosion coating composed of zinc and unavoidable impurities. This anticorrosion coating has continuous microchannels which connect the steel substrate to an ambient atmosphere.

The effect of the microchannels is that diffusible hydrogen, having diffused into the steel substrate in the course of a pretreatment prior to zinc coating, for example, is able to emerge again through the anticorrosion coating and does not remain enclosed in the steel substrate.

In order to be able to coat an uncoated flat steel product, which is typically protected from oxidation with anticorrosion oil, a pretreatment is necessary. The pretreatment more particularly comprises deoiling (for example, an alkaline degrease in combination with an electrolytic degrease) and also a surface processing step or activation step (for example, pickling). In all such steps, diffusible hydrogen may be taken up by the steel substrate. A common zinc coating would hinder the degassing of this hydrogen, causing it to remain bound in the steel substrate and lead to hydrogen embrittlement. The microchannels according to the invention, conversely, allow the hydrogen taken up to degas.

In one preferred variant embodiment, the microchannels have a density which is greater than 1 $mm^{-1}$ (i.e., 1 channel per 1 mm), 10 $mm^{-1}$ (i.e., 1 channel per 100 μm), preferably greater than 50 $mm^{-1}$ (i.e., 1 channel per 20 μm), more particularly greater than 100 $mm^{-1}$ (i.e., 1 channel per 10 μm). The density of the microchannels is determined in the perpendicular, metallographic polished section of the flat steel product. Image recognition is used to determine the number of the continuous microchannels on a representative portion of the polished section. The density is obtained as a number per unit length of the polished section (in the direction of extent of the flat steel product). Since the hydrogen in the steel substrate has relatively free mobility, a low density of microchannels is already sufficient to enable degassing of the hydrogen. As the density of the microchannels goes up, there is a drop in the blocking effect of the anticorrosion coating on hydrogen diffusion. This is advantageous, since it accelerates the degassing process.

In the case of one specific development, the microchannels run substantially perpendicular to the surface of the steel substrate. For the purposes of this application, this means that more than 90% of all the microchannels have a profile such that in the perpendicular polished section, more than 70% of the length of the respective microchannel is at an angle of 75°-105° to the surface of the steel substrate.

The advantage of this profile for the microchannels is that the microchannels run relatively directly, i.e., over a short path, from the steel substrate through the anticorrosion coating to the ambient atmosphere. This ensures rapid diffusion of hydrogen through the microchannels.

In the case of one specific development, the microchannels have an angular distribution with a full width at half-maximum of more than 30°, more particularly more than 35°, preferably more than 40°. The full width at half-maximum of the angular distribution of the microchannels is determined by using image recognition to determine an angle of inclination initially for at least 100 microchannels adjacent in a polished section. For this purpose, the centerpoint of the near-substrate end of each microchannel is ascertained and is joined to the centerpoint of the substrate-remote end of the respective microchannel. The angle of this joining line to the substrate surface is designated as the angle of inclination of this microchannel. In the case of an exactly perpendicular microchannel, therefore, the angle of inclination would be 90°. From the frequency distribution of the angles of inclination for at least 100 adjacent microchannels, statistical evaluation is used to determine a full width at half-maximum (FWHM). A full width at half-maximum of more than 30° means that the microchannels do not all run parallel to one another, but are instead distributed substantially over the 75°-105° range.

This angular distribution has a number of advantages. Firstly, inclined microchannels are longer by comparison with perpendicular microchannels, and so corrosion media are less able to penetrate to the substrate. The corrosion resistance is therefore better. Secondly, a construction of this kind with varying angles of inclination withstands relatively high loads during forming. During forming, by comparison, uniform arrangements with parallel microchannels are more susceptible to cracking in the coat.

The flat steel product is more particularly developed in such a way that the anticorrosion coating has a thickness d of 1-20 μm. The thickness is preferably 5 μm or more. Independently of this, the thickness more particularly is not more than 10 μm. More preferably the thickness is 5-10 μm. Coats of less than 1 μm typically do not provide adequate protection from corrosion. For typical automotive components made from flat steel products, sufficient corrosion protection through to the end of the product lifetime is achieved at a coat thickness of 5 μm or more. Up to a thickness of 20 μm, corrosion protection is improved. Beyond this thickness there is no longer any significant improvement. Moreover, excessively thick coats (greater than 20 μm) are not preferred, owing to the correspondingly longer coating time and the higher costs of material.

In the case of one specific development of the flat steel product, the anticorrosion coating has a blocking effect S for hydrogen permeation which is not more than 90%, preferably not more than 80%.

The blocking effect for hydrogen permeation is measured by means of a Devanathan/Stachursky permeation cell, using the DIN EN ISO 17081 standard. In this arrangement, a sample coated with zinc on one side is clamped between two half-cells, with one cell serving as H-loading cell and the other as measuring cell. The uncoated side of the sample is coated with palladium. The samples are then installed in the permeation cell such that the zinced side is facing the H-loading cell. A 0.2 m NaCl solution serves as electrolyte. The test solution is admixed with 20 mg/l of thiourea as a recombination inhibitor. A cathodic current density for H loading of 10 mA/cm² and a test temperature of 50° C. were selected. In this configuration, the loading current $I_{Zn}$ is measured. For comparison, the identical measurement of the loading current $I_0$ is carried out with an identical, dezinced sample. The blocking effect is defined as:

$$S = 1 - \frac{I_{Zn}}{I_0}$$

Owing to the formation of a ratio relative to the reference sample, the value measured for the blocking effect is independent of the sample geometry (size and thickness of the sample) and of the thickness of the palladium coating.

The advantage of a lower blocking effect is that hydrogen taken up by the substrate is able effectively to escape through the anticorrosion coating into the ambient atmosphere.

In the case of one preferred variant embodiment, the anticorrosion coating has a hydrogen permeation time of less than 500 s, preferably less than 150 s. The hydrogen permeation time is the time which additionally elapses, for a zinc-coated flat steel product in comparison to the uncoated product, until the hydrogen generated in the Devanathan/Stachursky permeation cell is detected.

The steel substrate of the flat steel product is more particularly a high-strength, preferably an ultra-high-strength, steel. This means that the tensile strength is more than 590 MPa, more particularly more than 780 MPa. With particular preference the tensile strength is more than 1000 MPa, more particularly more than 1200 MPa. The higher the tensile strength of the substrate, the more relevant the coating of the invention, since the rise in tensile strength is accompanied by increases in the susceptibility to hydrogen embrittlement and hence to brittle fractures.

The steel substrate is formed in particular of a multiphase steel, more particularly of a complex phase steel (CP) or of a dual phase steel (DP) or of a martensite phase steel (MS). Complex phase steels have a structure consisting very largely of bainite. CP steels have a high tensile strength, but suffer from a relatively low deformability, which prevents the design of components with complex geometries. Dual phase steels have a structure consisting of a combination of hard structural constituents (e.g., martensite and/or bainite) and soft structural constituents (e.g., ferrite). DP steels are suitable for complex components, by virtue of their combination of high strength and good deformability.

According to one preferred variant embodiment, the steel substrate is composed of a multiphase steel having the following analysis (figures in wt %):
C: 0.06-0.25 wt %
Si: 0.01-2.00 wt %
Mn: 1.00-3.00 wt %
Optionally one or more of the following elements:
P: up to 0.05 wt %
S: up to 0.01 wt %
Al: up to 1.00 wt %
Cr: up to 1.00 wt %
Cu: up to 0.20 wt %
Mo: up to 0.30 wt %
N: up to 0.01 wt %
Ni up to 0.30 wt %
Nb: up to 0.08 wt %
Ti: up to 0.25 wt %
V: up to 0.15 wt %
B: up to 0.005 wt %
Sn: up to 0.05 wt %
Ca: up to 0.01 wt %
Balance iron and unavoidable impurities.

The steel substrate more particularly is a cold-rolled multiphase steel having the following analysis (figures in wt %):
C: 0.06-0.25 wt %
Si: 0.10-2.00 wt %
Mn: 1.50-3.00 wt %

Optionally one or more of the following elements:
P: up to 0.05 wt %
S: up to 0.01 wt %
Al: up to 1.00 wt %
Cr: up to 1.00 wt %
Cu: up to 0.20 wt %
Mo: up to 0.30 wt %
N: up to 0.01 wt %
Ni up to 0.20 wt %
Nb: up to 0.06 wt %
Ti: up to 0.20 wt %
V: up to 0.10 wt %
B: up to 0.005 wt %
Sn: up to 0.05 wt %
Ca: up to 0.01 wt %
Balance iron and unavoidable impurities.

In the case of an alternative variant, the steel substrate more particularly is a hot-rolled multiphase steel having the following analysis (figures in wt %):
C: 0.06-0.25 wt %
Si 0.01-2.00 wt %
Mn: 1.00-3.00 wt %
Optionally one or more of the following elements:
P: up to 0.05 wt %
S: up to 0.005 wt %
Al: up to 1.00 wt %
Cr: up to 1.00 wt %
Cu: up to 0.20 wt %
Mo: up to 0.30 wt %
N: up to 0.01 wt %
Ni up to 0.25 wt %
Nb: up to 0.08 wt %
Ti: up to 0.25 wt %
V: up to 0.15 wt %
B: up to 0.005 wt %
Sn: up to 0.05 wt %
Ca: up to 0.01 wt %
Balance iron and unavoidable impurities.

In the case of one preferred variant embodiment, the anticorrosion coating is applied by physical vapor deposition (PVD). For this purpose a coating material which is initially present in solid or liquid form is usually vaporized by physical processes. This may be accomplished, for example, thermally by direct heating of the coating material (via an electric arc, for example), by bombardment with a beam of electrons or ions, or by illumination with a laser beam. So that the vapor particles of the vaporized coating material are able to reach the workpiece to be coated and are not lost for coating through collision with gas particles in the ambient atmosphere, the process for PVD coating is carried out in a coating chamber under subatmospheric pressure.

This coating process has a variety of advantages. Firstly, a known feature of such processes is that inherently they introduce only very little hydrogen, or none, into the starting substrate. Secondly, it is not necessary to heat the steel substrate too greatly. In the case of hot dip galvanizing, for example, the steel substrate is necessarily heated to temperatures of more than 460° C. (the zinc bath temperature). At these temperatures, however, a hard constituent of the substrate structure, more particularly martensite, is annealed, thereby robbing the steel substrate of its characteristics. This is particularly relevant in the case of DP steels as steel substrate, in particular. All in all, trials have shown that all of the steel substrates described above with appropriately high tensile strength can be coated without faults by means of vapor deposition.

The object according to the invention is likewise achieved by means of a process for producing an above-described flat steel product. This process comprises the following steps:
producing or providing a steel substrate
optionally deoiling the steel substrate
optionally pickling the steel substrate
applying the anticorrosion coating composed of zinc and unavoidable impurities to the steel substrate by means of physical vapor deposition, where the anticorrosion coating has a thickness d and the ratio of thickness of the anticorrosion coating d to coating rate r on application of the anticorrosion coating is less than 1000 s, preferably less than 800 s.

In other words:

$$\frac{d}{r} < 1000 \text{ s, preferably } \frac{d}{r} < 800 \text{ s}$$

Trials have shown that a low blocking effect for hydrogen permeation is obtained if this ratio is particularly small.

In the case of one specific, particularly preferred embodiment, the ratio is less than 10 s, more particularly less than 5 s, preferably less than 2.0 s, more particularly less than 1.5 s, very preferably less than 1.0 s. Within a short time, therefore, it is possible to apply an anticorrosion coating which has a significant thickness (preferably a thickness of 5-10 μm) but which nevertheless has a very low blocking effect for hydrogen permeation. This process is therefore very suitable for the continuous coating of long steel strips.

In particular, the process is developed in such a way that the temperature of the steel substrate on application of the anticorrosion coating is greater than 50° C., preferably greater than 100° C., very preferably greater than 150° C., more particularly greater than 200° C. It has emerged that this preconditioning is advantageous in order to achieve sufficient coat adhesion. In this context, by means of the ball impact test according to SEP1931, determinations were made as to whether coat adhesion is sufficient. If there was flaking of the coat during the ball impact test, the coat adhesion was classified as "unsatisfactory (not OK)". In the cases without flaking, the coat adhesion was classified as "satisfactory (OK)".

According to one preferred embodiment, it is provided that the anticorrosion coating composed of zinc and unavoidable impurities is applied to the steel substrate by means of physical vapor deposition by providing the steel substrate in a coating chamber, where the pressure in the coating chamber is regulated. Here, zinc as coating material is caused to flow into the coating chamber at an inflow point, the zinc being conditioned to a temperature.

According to one preferred embodiment of the present invention, it is provided that pressure and temperature are adjusted such that the temperature is above the dew point of the coating material. At a temperature above the dew point of the coating material, the coating material is present in its gaseous phase. If the pressure is adapted, increased, for example, the dew point is displaced, toward higher temperatures in the example. A corresponding subsequent regulation of the temperature ensures that the coating material is present in gaseous form.

According to a further preferred embodiment of the present invention, it is provided that the pressure is adjusted to between 1 mbar and 100 mbar, preferably to between 10 mbar and 100 mbar. This ensures that little coating material is lost for coating by scattering of particles in the coating chamber. At the same time, the pressure is within a range which can be realized in the course of commercial application in industrial plants, as in the case of the coating of steel strips, for example.

According to a further preferred embodiment of the present invention, it is provided that, in addition to the coating material, an inert gas is caused to flow into the coating chamber at a further inflow point and the pressure selected is the total pressure, consisting of the partial pressure of the coating material and the partial pressure of the inert gas, with the partial pressure of the coating material and the partial pressure of the inert gas being adjusted in order to adjust the pressure. If the partial pressure of the coating material is not sufficient for a slip flow or continuum flow, then through the inert gas it is possible to increase the total pressure to an extent such that there is a slip or continuum flow. It is conceivable for the further inflow point to be removed from the inflow point. It is also conceivable, however, for the coating material to be caused to flow into the coating chamber as a mixture with the inert gas.

The table below is intended to illustrate a number of examples of combinations of pressure and temperature. The computed dew point in the table is for zinc as coating material.

| Pressure [mbar] | Dew point [K] |
|---|---|
| 100 | 985 |
| 10 | 851 |
| 1 | 750 |

According to a further preferred embodiment of the present invention, it is provided that nitrogen and/or argon is used as inert gas. Nitrogen and argon are outstandingly suitable as inert gas. Both gases do not negatively influence the PVD coating and are, in addition, suitable for purging the coating chamber.

According to a further preferred embodiment of the present invention, it is provided that the inert gas is preheated, more particularly before the inflow point, in order to prevent cooling of the coating material.

The invention is elucidated in more detail using the figures, in which

Figure 1:
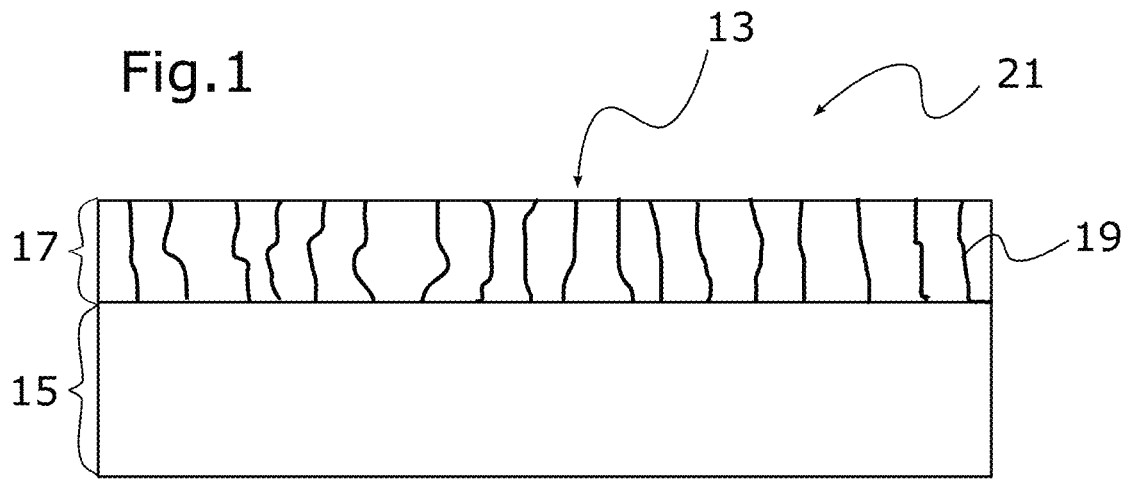
FIG. 1 shows a schematic representation of a flat steel product having an anticorrosion coating.
Figure 2:
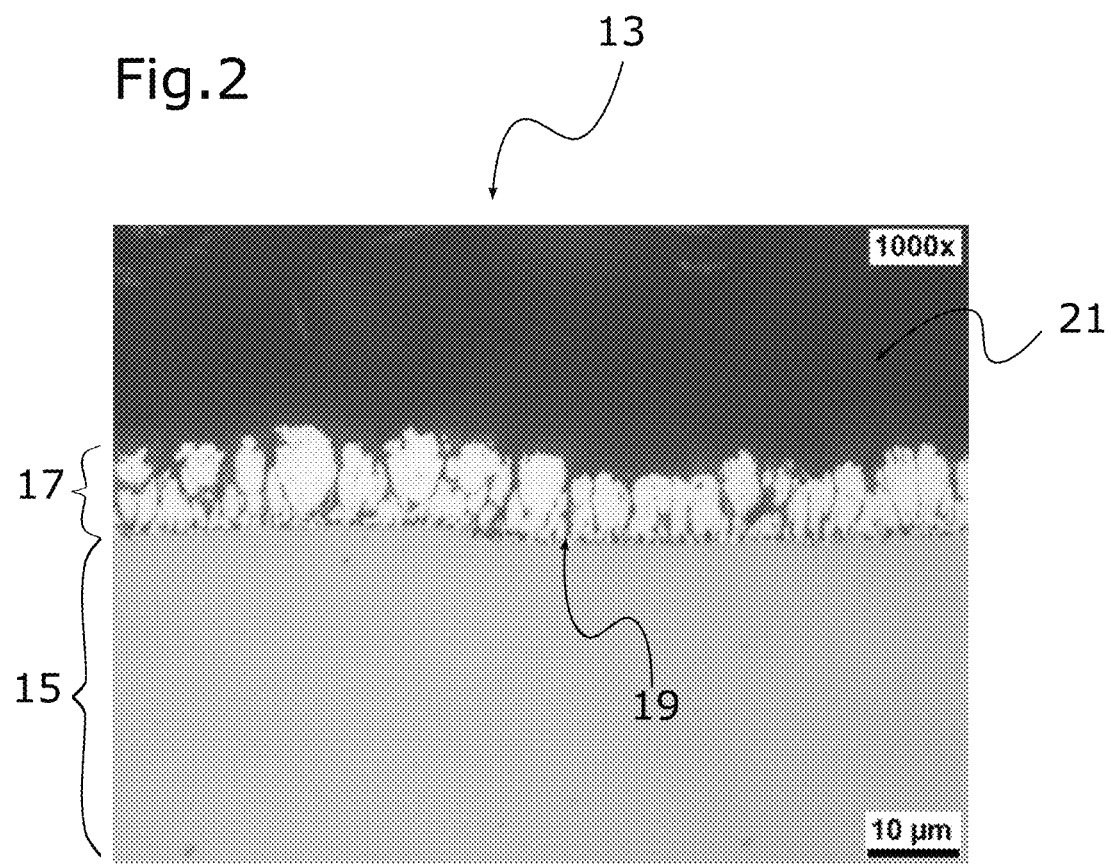
FIG. 2 shows an image of a polished section of a flat steel product having an anticorrosion coating.

FIG. 1 shows a schematic representation of a flat steel product 13. The flat steel product 13 comprises a steel substrate 15 and an anticorrosion coating 17 present on one side of the steel substrate 15. The anticorrosion coating 17 consists of zinc and unavoidable impurities. The anticorrosion coating 17 has continuous microchannels 19 which connect the steel substrate 15 to an ambient atmosphere 21. (For greater clarity, of the 18 microchannels represented, only the microchannel disposed on the far right is provided with a reference sign.) FIG. 2 shows a perpendicular polished section of the flat steel product 13. This is the exemplary embodiment with number 10 in table 1, which is elucidated below. The flat steel product 13 comprises a steel substrate 15 composed of a cold-rolled multiphase steel having the analysis A as indicated below:

C: 0.11 wt %
Si: 0.43 wt %
Mn: 2.44 wt %
Optionally one or more of the following elements:
P: 0.01 wt %
S: 0.002 wt %
Al: 0.03 wt %
Cr: 0.62 wt %
Cu: 0.05 wt %
Mo: 0.07 wt %
N: 0.004 wt %
Ni 0.05 wt %
Nb: 0.038 wt %
Ti: 0.022 wt %
V: 0.007 wt %
B: 0.0013 wt %
Sn: 0.02 wt %
Ca: 0.002 wt %
Balance iron and unavoidable impurities.

The flat steel product 13 additionally comprises an anticorrosion coating 17 present on one side of the steel substrate 15. The anticorrosion coating 17 has a thickness d of 9 µm and consists of zinc and unavoidable impurities. The anticorrosion coating 17 has continuous microchannels 19 which connect the steel substrate 15 to an ambient atmosphere 21. (For greater clarity, here again, only one of the microchannels is provided with a reference sign.) In the image detail shown, there are about 27 microchannels, corresponding to a density of 29 channels per 100 µm or 290 mm^−1.

The table below shows a number of exemplary embodiments and the process parameters associated with their production. For all of the samples, moreover, the coat adhesion was determined by means of the SEP1931 ball impact test. If flaking of the coat occurred during the ball impact test, the coat adhesion was classified as "unsatisfactory (not OK)". In the cases without flaking, the coat adhesion was classified as "satisfactory (OK)".

In all of the exemplary embodiments, the substrate used was a steel blank having a thickness of 1.8 mm. This steel blank consisted of a steel having the analysis indicated with reference to FIG. 2.

Example 1 is the reference sample used for determining the blocking effect S. Samples 1-10 were coated by means of vapor deposition (PVD). In the case of examples 2-8, an electron beam evaporator was used in order to melt and evaporate the zinc coating material. In the case of exemplary embodiments 9 and 10, the zinc coating material was melted and evaporated by means of an electric arc. Examples 2-5 were coated at a substrate temperature of room temperature (i.e., less than 50° C.). In these cases, anticorrosion coatings having a different thickness between 0.5 µm and 12 µm were generated. In all four cases, the coat adhesion was inadequate. In the case of examples 6 to 8, the substrate was preconditioned to a temperature of 200° C. With a coating rate of 8 nm/s, coat thicknesses of between 1 and 8 µm were generated. Samples 6 and 7 exhibit not only good coat adhesion but also good hydrogen permeability. In the case of samples 9 and 10, the substrate was preconditioned to a temperature of 240° C. With a significantly higher coating rate of 7000 nm/s and 10 000 nm/s, respectively, coat thicknesses of 6.5 µm and 9 µm were generated. Samples 9 and 10 exhibit not only good coat adhesion but also good hydrogen permeability. As a comparison, samples 11 and 12 were galvanized electrolytically. Sample 12, moreover, was thermally aftertreated by being held at a temperature of 2000 for 60 minutes in a protective gas atmosphere. In both cases, the blocking effect S found is extremely high, and so hydrogen introduced remains in the substrate. These samples are therefore susceptible to hydrogen embrittlement.

TABLE 1

| No. | Type | Coating Substrate temperature/° C. | Coating Thickness d [μm] | Coating Rate r [nm/s] | Coating transient time relative to uncoated substrate/s | Blocking effect S [%] | Adhesion | Ratio d/r |
|---|---|---|---|---|---|---|---|---|
| 1 | uncoated | — | — | — | 0 | 0 | — | — |
| 2 | PVD | <50 | 0.5 | 8 | 0 | 30 | not OK | 62.50 |
| 3 | PVD | <50 | 2.5 | 8 | 0 | 47 | not OK | 312.50 |
| 4 | PVD | <50 | 7 | 8 | 90 | 60 | not OK | 875.00 |
| 5 | PVD | <50 | 12 | 8 | 130 | 74 | not OK | 1500.00 |
| 6 | PVD | 200 | 1 | 8 | 0 | 18 | OK | 125.00 |
| 7 | PVD | 200 | 5 | 8 | 100 | 80 | OK | 625.00 |
| 8 | PVD | 200 | 8 | 8 | >80 000 | >95 | OK | 1000.00 |
| 9 | PVD | 240 | 6.5 | 7000 | 40 | 57 | OK | 0.93 |
| 10 | PVD | 240 | 9 | 10 000 | 40 | 60 | OK | 0.90 |
| 11 | ZE as deposited | 55 | 8 | 200 | 8000 | >95 | OK | 40.00 |
| 12 | ZE-thermally aftertreated | 55 | 8 | 200 | 13 000 | >95 | OK | 40.00 |

Figure 3:
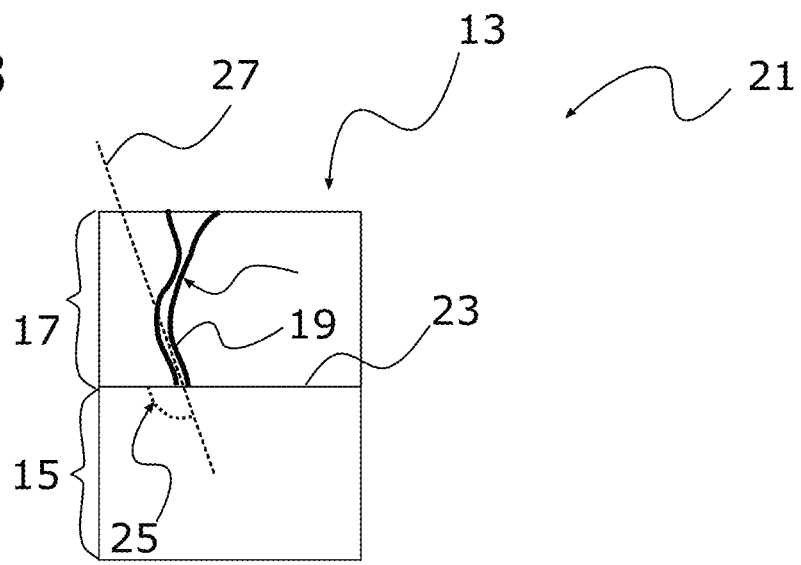
FIG. 3 shows a schematic detail of a microchannel.

FIG. 3 shows a schematic detail of a microchannel 19 within an anticorrosion coating 17. The microchannel 19 connects the steel substrate 15 to the ambient atmosphere. The microchannel 19 runs substantially perpendicular to the surface 23 of the steel substrate 15. The bottom third of the microchannel 19 represented runs at an angle of 110° to the surface 23 of the steel substrate 15. This is shown by the angle 25 between the surface 23 of the steel substrate 15 and the tangent 27. The tangent 27 is fitted to the profile of the microchannel 19 in the bottom third. In the further profile, the microchannel makes a right curve and runs initially almost perpendicularly and then at an angle of about 70° to the surface 23 of the steel substrate 15, before the microchannel 19 in the manner of a funnel expands in the manner of a funnel to the surface of the anticorrosion coating. The profile in the region of the funnellike expansion is again almost perpendicular to the surface 23 of the steel substrate 15. In analogy to the bottom third, the respective angle is determined by fitting a tangent and determining the angle of the tangent to the surface 23. For greater clarity, only the tangent 27 fitted to the profile in the bottom third is represented.

Figure 4:
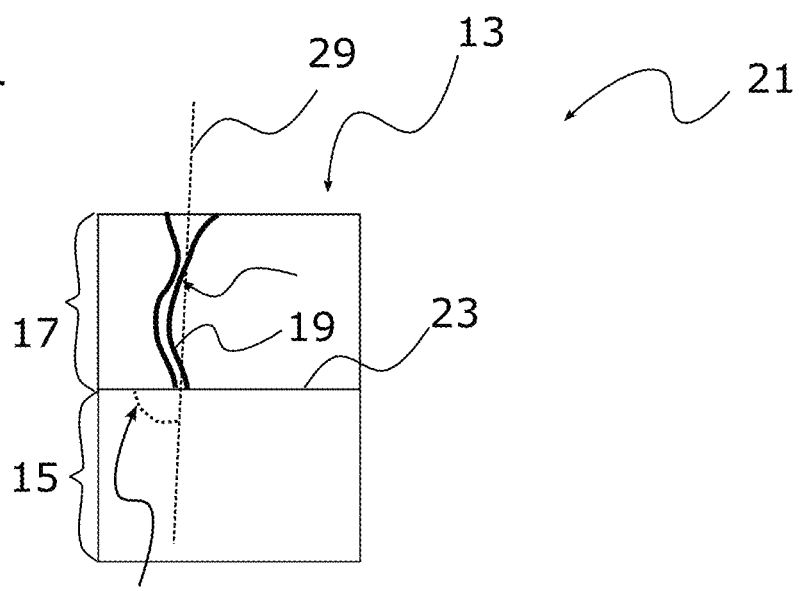
FIG. 4 shows a schematic detail of a microchannel.

FIG. 4 shows a schematic detail of a microchannel 19 within an anticorrosion coating 17. The microchannel 19 connects the steel substrate 15 to the ambient atmosphere. The microchannel 19 has an angle 31 of inclination. The angle 31 of inclination is determined by ascertaining the centerpoint of the near-substrate end of the microchannel 19 and connecting it to the centerpoint of the substrate-remote end of the microchannel 19. The angle of this connecting line 19 to the substrate surface 23 is referred to as the angle 31 of inclination of the microchannel 19.

Figure 5:
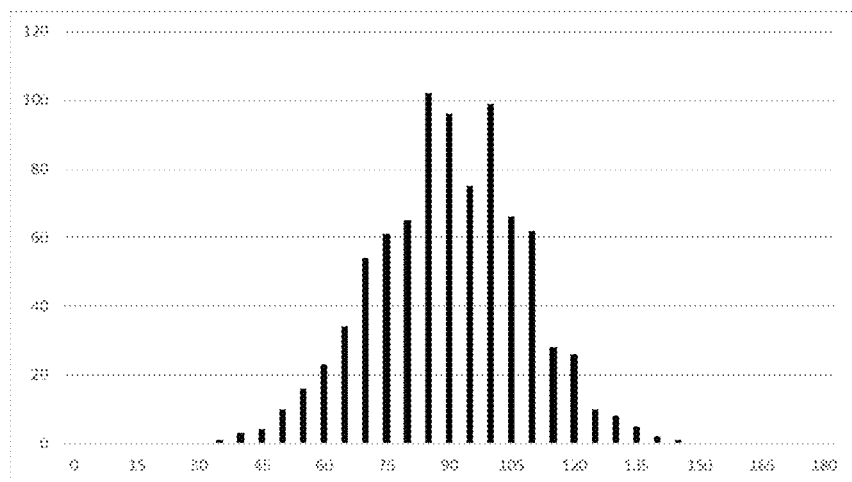
FIG. 5 shows an angular distribution of the microchannels.

FIG. 5 shows an angular distribution of the microchannels in the form of a histogram of the angles of inclination. The number of angles of inclination determined within the respective range is plotted. The step width chosen has been 5°. A total of 930 microchannels have been evaluated. The full width at half-maximum is 42°.

The invention claimed is:

1. A flat steel product comprising:
a steel substrate having, present at least on one side of the steel substrate, anticorrosion coating composed of zinc and unavoidable impurities, the anticorrosion coating applied by physical vapor deposition;
wherein the anticorrosion coating has continuous microchannels which connect the steel substrate to an ambient atmosphere, wherein the microchannels have a density which is greater than 10 mm$^{-1}$, the microchannels resulting from the physical vapor deposition anticorrosion coating, wherein the microchannels have an angular distribution having a full width at half-maximum of more than 30°.

2. The flat steel product as claimed in claim 1, wherein the microchannels have a density which is greater than 50 mm$^{-1}$.

3. The flat steel product as claimed in claim 2, wherein the microchannels have a density which is greater than 100 mm$^{-1}$.

4. The flat steel product as claimed in claim 1 wherein the microchannels run substantially perpendicular to the surface of the steel substrate.

5. The flat steel product as claimed in claim 4 wherein the anticorrosion coating has a thickness d of 5-10 μm.

6. The flat steel product as claimed in claim 5 wherein the anticorrosion coating has a blocking effect for hydrogen permeation which is not more than 80%.

7. The flat steel product as claimed in claim 6 wherein the anticorrosion coating has a hydrogen permeation time which is less than 500 s.

8. The flat steel product of claim 7 wherein the anticorrosion coating has a hydrogen permeation time which is less than 150 s.

9. The flat steel product as claimed in claim 7 wherein the steel substrate has a tensile strength of more than 1200 MPa.

10. The flat steel product as claimed in claim 9 wherein the steel substrate is a multiphase steel.

11. The flat steel product as claimed in claim 10 wherein the steel substrate is one of a cold-rolled and hot-rolled multiphase steel.

12. A process for producing a flat steel product as claimed in claim 11, with steps as follows:
producing or providing a steel substrate;
degreasing;

pickling; and applying the anticorrosion coating composed of zinc and unavoidable impurities to the steel substrate by means of physical vapor deposition;

where the anticorrosion coating has a thickness d and the ratio of thickness of the anticorrosion coating d to the coating rate r on application of the anticorrosion coating is less than 800 s.

13. The process as claimed in claim 12 wherein the temperature of the steel substrate on application of the anticorrosion coating is greater than 150° C.

14. The process as claimed in claim 12 wherein the anticorrosion coating composed of zinc and unavoidable impurities is applied to the steel substrate by means of physical vapor deposition by providing the steel substrate in a coating chamber, where the pressure in the coating chamber is regulated and where zinc as coating material is caused to flow into the coating chamber at an inflow point, the zinc being conditioned to a temperature.

15. The process as claimed in claim 14 wherein pressure and temperature are adjusted such that the temperature is above the dew point of the coating material and the pressure to between 1 mbar and 100 mbar.

16. The process as claimed in claim 15 wherein pressure and temperature are adjusted such that the temperature is above the dew point of the coating material and the pressure to between 10 mbar and 100 mbar.

* * * * *